United States Patent
Appel et al.

(10) Patent No.: US 8,084,857 B2
(45) Date of Patent: Dec. 27, 2011

(54) METHOD AND ARTICLE OF MANUFACTURE FOR WIRE BONDING WITH STAGGERED DIFFERENTIAL WIRE BOND PAIRS

(75) Inventors: Gavin Appel, Allentown, PA (US); Ashley Rebelo, Emmaus, PA (US); Christopher J. Wittensoldner, Alburtis, PA (US)

(73) Assignee: Agere Systems, Allentown, PA (US)

( * ) Notice: Subject to any disclaimer, the term of this patent is extended or adjusted under 35 U.S.C. 154(b) by 0 days.

(21) Appl. No.: 12/692,209

(22) Filed: Jan. 22, 2010

(65) Prior Publication Data
US 2010/0120198 A1    May 13, 2010

Related U.S. Application Data

(62) Division of application No. 11/065,838, filed on Feb. 25, 2005, now Pat. No. 7,675,168.

(51) Int. Cl.
*H01L 23/495* (2006.01)

(52) U.S. Cl. ........ 257/728; 257/784; 257/786; 257/659; 257/678

(58) Field of Classification Search .................. 257/728, 257/784, 786, 659, 678
See application file for complete search history.

(56) References Cited

U.S. PATENT DOCUMENTS

| | | | |
|---|---|---|---|
| 5,801,450 A | 9/1998 | Barrow | |
| 6,005,293 A | 12/1999 | Mori | |
| 6,538,336 B1 * | 3/2003 | Secker et al. | 257/786 |
| 6,812,580 B1 | 11/2004 | Wenzel et al. | |
| 7,002,249 B2 * | 2/2006 | Duffy et al. | 257/728 |

FOREIGN PATENT DOCUMENTS

| | | |
|---|---|---|
| JP | 09-064087 | 3/1997 |
| JP | 2000-340711 | 12/2000 |
| JP | 2001-298039 | 10/2001 |

OTHER PUBLICATIONS

M. Grupen Shemansky, et al., "When the Package Means as Much as the Chip," EDN, pp. 51-56, Jul. 2003.

* cited by examiner

*Primary Examiner* — Long Pham
(74) *Attorney, Agent, or Firm* — Ryan, Mason & Lewis, LLP

(57) ABSTRACT

A method and article of manufacture for performing wire-bonding operations in an integrated circuit. In one aspect, the operations include the steps of bonding a wire to a first bond site in the integrated circuit and terminating the wire at a second bond site. The bonding and terminating steps are repeated for at least two differential wire bond pairs, and proximate differential wire bond pairs of the at least two differential wire bond pairs have substantially different wire bond profiles.

20 Claims, 4 Drawing Sheets

FIG. 7
| | SINGLE ENDED CROSSTALK (dB) | DIFFERENTIAL CROSSTALK (dB) |
|---|---|---|
| ORIGINAL | −16 | −34 |
| LONG ARC | −18 | −37 |
| STAGGERED | −20 | −43 |
FIG. 8
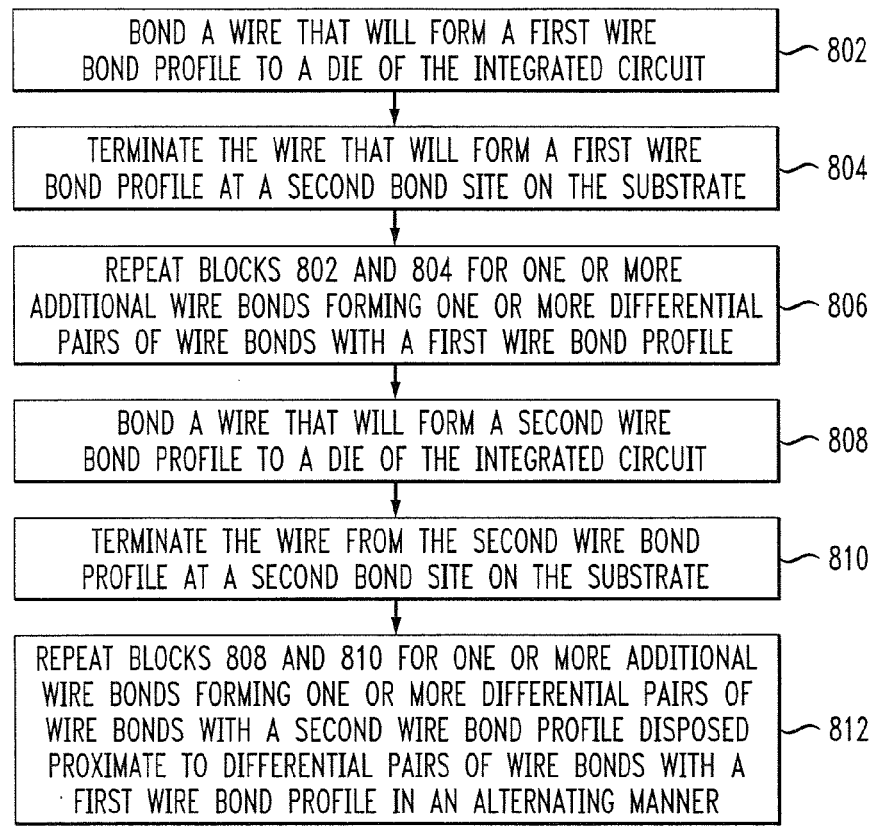
FIG. 9
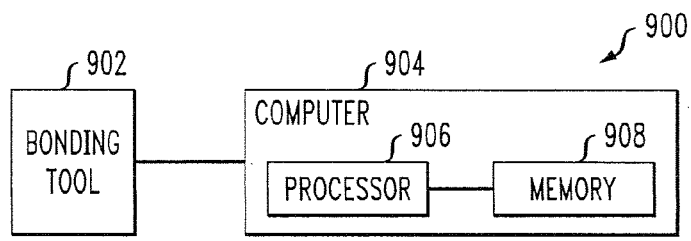

METHOD AND ARTICLE OF MANUFACTURE FOR WIRE BONDING WITH STAGGERED DIFFERENTIAL WIRE BOND PAIRS

CROSS-REFERENCE TO RELATED APPLICATION(S)

This application is a divisional of U.S. application Ser. No. 11/065,838 filed on Feb. 25, 2005 now U.S. Pat. No. 7,675,168, the disclosure of which is incorporated herein by reference.

FIELD OF THE INVENTION

The present invention relates generally to the field of integrated circuits and, more particularly, to wire-bonding operations performed on an integrated circuit.

BACKGROUND OF THE INVENTION

An integrated circuit may include multiple transistor die that are placed in an integrated circuit package by a die attach machine. A robotic bonding tool may be used to wire bond the die to a package substrate, leads of a package leadframe, or other circuit elements within the package. Such a tool generally includes a surface/wire-feed detection system that detects bond pads or other bond sites of a given die. The other circuit elements in an integrated circuit may include, for example, tuning capacitors.

The wire bonding of the various circuit elements may create several differently-shaped wire bond profiles, depending on the placement of the various circuit elements to be connected by wire bonds. A wire bond profile may be characterized as a side or profile view of a wire extending from a first bond site to a second bond site. In an integrated circuit, the wire bonds may carry high frequency signals. It is important for these wire bond profiles to achieve a desired shape for optimal high speed data signal performance, for example at least approximately 2.5 Gb/s.

The wire bonds of an integrated circuit are typically parallel to one another in a plan view of the integrated circuit. This parallel configuration results in a high level of mutual coupling between neighboring wire bonds. Thus, wire bonds packed tightly together result in a substantial mutual coupling. As the mutual coupling increases, the stability of the electrical performance and operating bandwidth decreases. The noise generated by crosstalk in each interface may result in bit errors that limit the system data throughput.

Previous attempts to solve the problem of mutual coupling include increasing the pitch of, or distance between, wire bonds at bond sites on the die. While increased distance between wire bonds assists in decreasing the mutual coupling between wire bonds, the number of wires that can be bonded to the die is decreased, resulting in an integrated circuit with a smaller overall number of wire bonds. Other attempts to reduce crosstalk between adjacent wire bonds include increasing the distance between wire bonds at the bond sites, or wedge bonds, on a substrate of the integrated circuit package. However, this also increases substrate size and resulting package size, which is directly proportional to cost. Flip chip technology has also been provided and recommended to those customers seeking a high speed device since many do not believe that a wire-bond package is capable of performing at desired high speeds.

Thus, a need remains for techniques for minimizing mutual coupling between wire bonds and the associated degradation of high speed signals in an integrated circuit.

SUMMARY OF THE INVENTION

The present invention in an illustrative embodiment provides an integrated circuit having wire bonds that permit improved high speed performance and techniques for configuring such wire bonds in the integrated circuit.

In accordance with one aspect of the invention, a method for performing a wire-bonding operation in an integrated circuit utilizes a bonding tool. A wire is bonded to a first bond site in the integrated circuit. The wire is terminated at a second bond site. The bonding and terminating steps are repeated for a plurality of additional wire bonds of the integrated circuit. Proximate differential wire bond pairs of the at least two differential wire bond pairs have substantially different wire bond profiles.

Advantageously, an illustrative embodiment of the present invention produces wire bonds that allow for improved high speed performance. The wire bond configuration of the illustrative embodiment of the present invention decreases crosstalk by increasing the distance between data signal wire bond pairs. The distance is increased through the formation of alternating different wire bond profiles and staggered wedge bond spacings at the substrate for differential wire bond pairs. Due to the increased spatial separation, a wire-bond package has the ability to achieve data rates that otherwise would have required a flip-chip package. Further, less separation is required between wire bonds in a plan view, resulting in reduced size and cost for the die and substrate, and the packaged integrated circuit as a whole. Thus, the illustrative embodiment allows system performance needs to be met while providing a cost competitive integrated circuit package.

These and other objects, features, and advantages of the present invention will become apparent from the following detailed description of the illustrative embodiments thereof, which is to be read in connection with the accompanying drawings.

BRIEF DESCRIPTION OF THE DRAWINGS

FIG. 7 is a chart illustrating single ended and differential crosstalk for different configurations of wire bonds, according to an embodiment of the present invention;

FIG. 8 is a flow diagram illustrating a bonding methodology for an integrated circuit, according to an embodiment of the present invention; and FIG. 9 is a block diagram illustrating an example bonding system suitable for implementing a wire-bonding technique, according to an embodiment of the present invention.

DETAILED DESCRIPTION

As will be described in detail below, the present invention in the illustrative embodiment provides an integrated circuit having wire bonds configured for improved high speed performance, and techniques for forming such wire bonds in the integrated circuit. The phrase "differential pair," as described herein, refers to two adjacent wire bonds having approximately the same wire bond profile reducing differential noise coupling and differential signal propagation delay. Further, the term "proximate," as described herein, refers to neighboring or next in spacial order.

Figure 1:
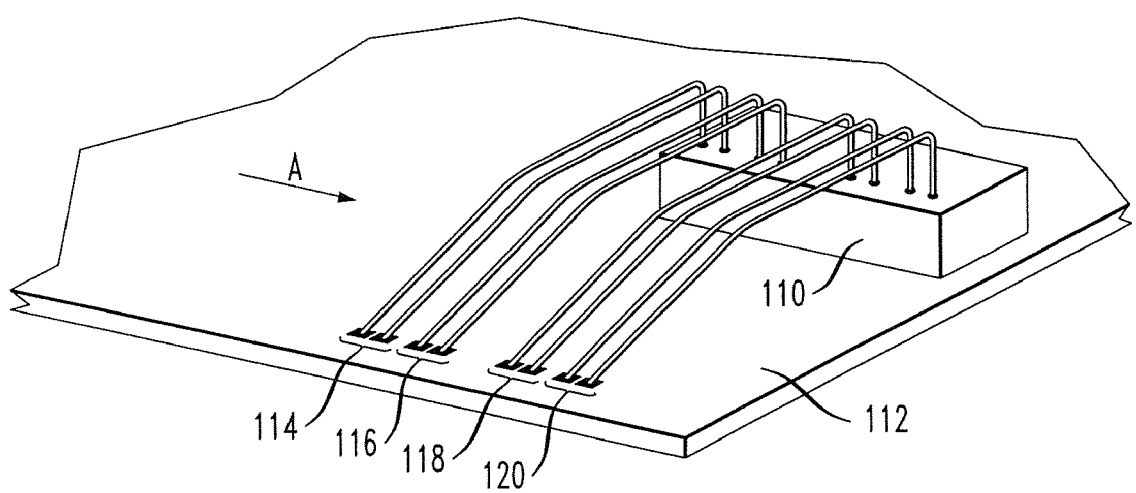
FIG. 1 is a diagram illustrating a perspective view of a portion of an integrated circuit having long arc differential wire bond pairs, according to an embodiment of the present invention.

Referring initially to FIG. 1, a perspective view of an integrated circuit having long arc differential wire bond pairs is illustrated. A die 110 is disposed in a packaged integrated circuit on a substrate 112. Much of the integrated circuit packaging is not shown so that the internal elements and wires are visible.

In many applications, it is desirable to ensure a high immunity to noise, since parasitic parameters such as inductance and capacitance may significantly degrade a signal. A technique for increasing noise immunity may be implemented through first, second, third and fourth differential wire bond pairs 114, 116, 118, 120, which are used to connect die 110 to substrate 112. In this embodiment, first and third differential wire bond pairs 114, 118 may be considered signal output wire bonds, while second and fourth differential wire bond pairs 116, 120 may be considered signal input wire bonds. However, any of the pairs mentioned may be considered signal input or signal output, and additional embodiments may have all input differential wire bond pairs or all output differential wire bond pairs. In a preferred embodiment, each wire bond of first, second, third and fourth differential wire bond pairs 114, 116, 118, 120 is terminated via a wedge bond on a corresponding trace in substrate 112.

Figure 2:
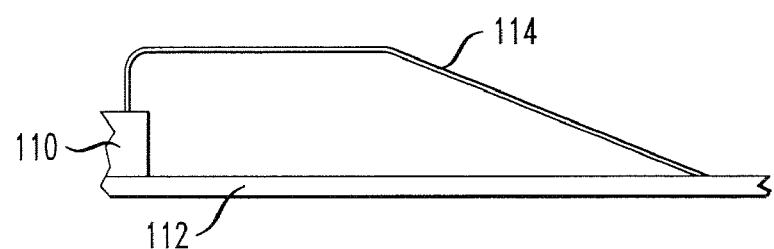
FIG. 2 is a diagram illustrating a side view of the integrated circuit of FIG. 1.

First, second, third and fourth differential wire bond pairs 114, 116, 118 and 120 have substantially identical wire bond profiles. The wire bond profile is an elongated or extended arc, which allows increased differential pair separation by increasing the spacing between the pairs as the wire bonds progress from die 110 to substrate 112. This pair separation decreases noise resulting from mutual coupling crosstalk. As illustrated in FIG. 2, the substantially identical wire bond profiles result in a profile view in which only a wire bond profile of first differential wire bond pair 114 is visible. Second, third and fourth differential wire bond pairs 116, 118 and 120 are hidden behind first differential wire bond pair 114 in this side view from direction A in FIG. 1.

Additional embodiments of the present invention may include various numbers of differential wire bond pairs and various wire bond profiles. For example, FIG. 1 illustrates the wire bond profile in three segments, however, the number of segments may vary or may not be discernable if there is a more continuous curve. Further the connections of the wire bonds may vary. For example, the wire bonds may terminate at other circuit elements or a leadframe of the integrated circuit instead of the substrate.

Figure 3:
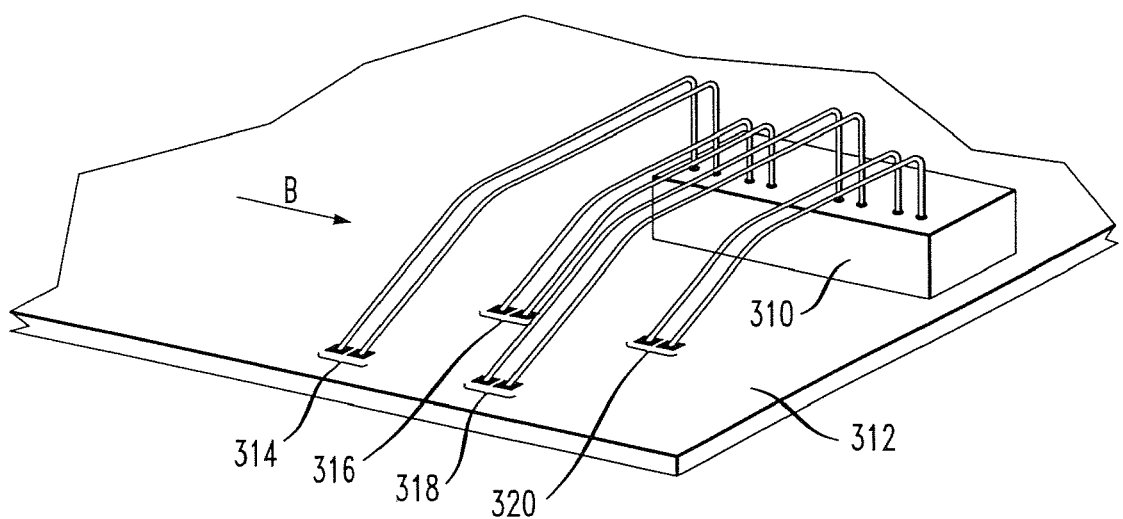
FIG. 3 is a diagram illustrating a perspective view of a portion of an integrated circuit having staggered differential wire bond pairs, according to an embodiment of the present invention.

FIG. 3 illustrates a perspective view of an integrated circuit having staggered differential wire bond pairs. A die 310 is typically disposed in an integrated circuit on a substrate 312. As in FIG. 1, much of the integrated circuit packaging is not shown so that the internal elements and wires are visible.

As shown in FIG. 3, first, second, third and fourth differential wire bond pairs 314, 316, 318, 320, connect die 310 to substrate 312. As in FIG. 1, first and third differential wire bond pairs 314, 318 have substantially identical wire bond profiles. Second and fourth differential wire bond pairs 316, 320 also have substantially identical wire bond profiles, but different wire bond profiles when compared to first and third differential wire bond pairs 314, 318. The difference in wire bond profiles results in a staggering of the pairs of wedge bonds terminating the wire bonds at substrate 312.

Figure 4:
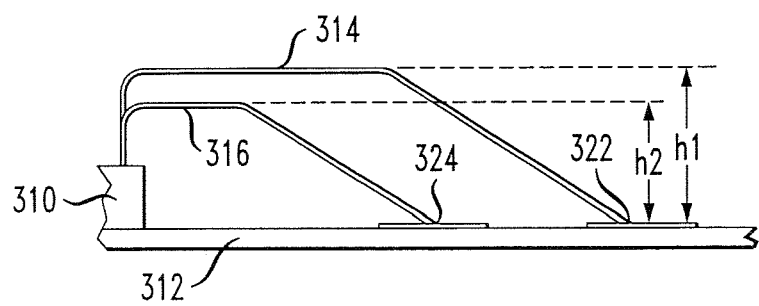
FIG. 4 is a diagram illustrating a side view of the integrated circuit of FIG. 3.

As illustrated in FIG. 4, a height h1 of the profile of first differential wire bond pair 314 above substrate 312 is greater than a height h2 of the profile of second differential wire bond pair 316 above substrate 312. Further, a wedge bond 322 of first differential wire bond pair 314 is a greater distance from die 310 than a wedge bond 324 of second differential wire bond pair 316. Third and fourth differential wire bond pairs 318, 320 are not visible in this side view from direction B because they have substantially identical wire bond profiles to first and second differential wire bond pairs 314, 316, respectively. Thus, FIGS. 3 and 4 illustrate one example of how separation between differential wire bond pairs can be achieved through the formation of different wire bond profiles.

FIGS. 3 and 4 illustrate embodiments where the wire bonds originate from the same die pad row on die 310. Other embodiments where the wire bonds originate from different die pad rows or when the wedge bonds at the substrate are in the same row, may utilize the same principle of maximizing spatial separation through differing wire bond profiles to achieve noise immunity. Further, additional embodiments may include different wire bond profile configurations with proximate differential wire bond pairs having different wire bond profiles. For example, differential wire bond pairs may each have a unique wire bond profile, or a series of differential wire bond pairs may alternate any number of wire bond profiles, for example, three or four wire bond profiles. These embodiments may be implemented as room on the substrate allows.

Figure 5:
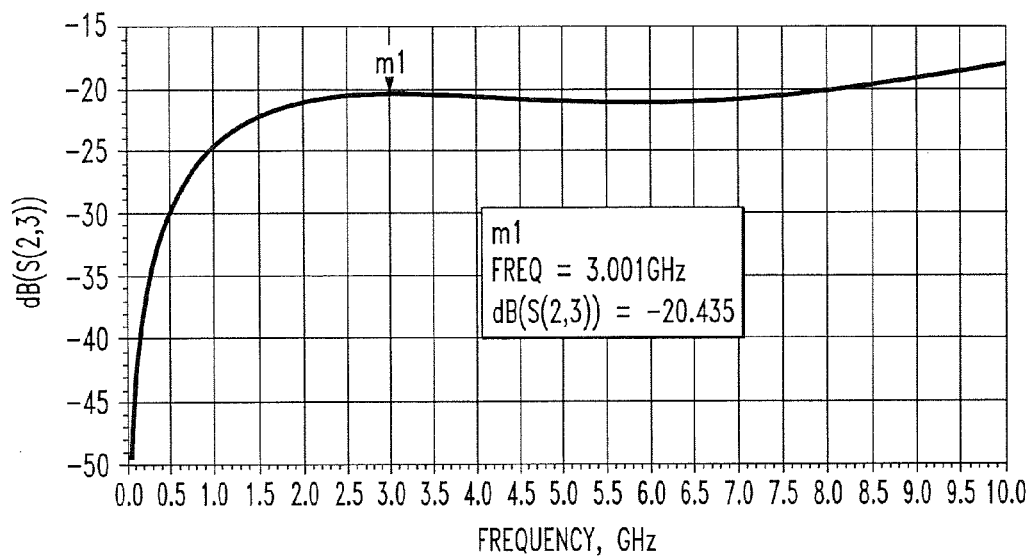
FIG. 5 is a graph illustrating single ended crosstalk for the staggered differential wire bond pairs of FIG. 3.
Figure 6:
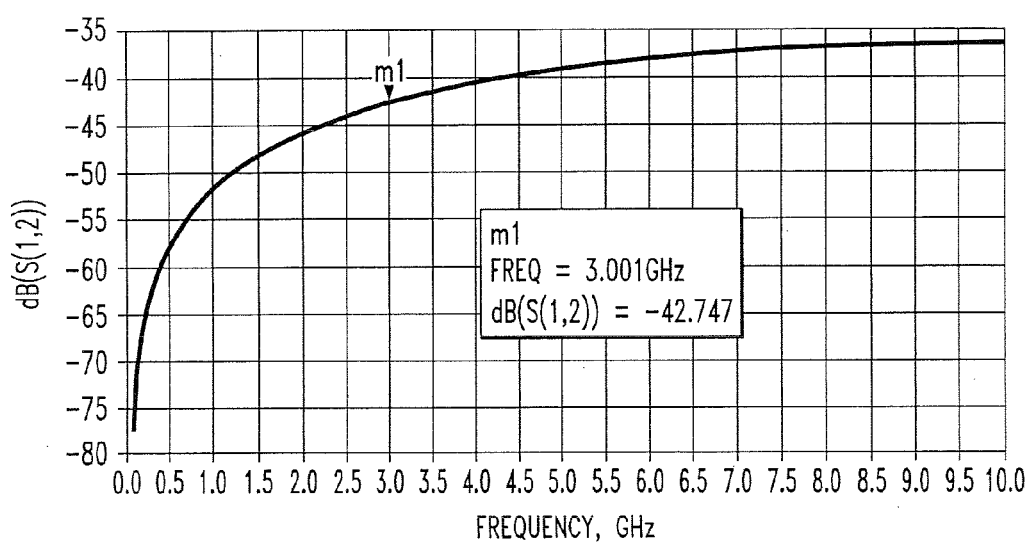
FIG. 6 is a graph illustrating differential crosstalk for adjacent staggered differential wire bond pairs of FIG. 3.

A graph shown in FIG. 5, illustrates single ended crosstalk for staggered differential wire bond pairs as provided in FIGS. 3 and 4. This graph and the results illustrated in FIGS. 6 and 7 provide crosstalk simulation results for differential wire bond design. The models are based on a three dimensional wire bond model simulated in a three dimensional electromagnetic tool.

FIG. 5 illustrates the relationship of frequency and noise level. Generally, as frequency increases, noise level also increases. A decibel (dB) is a way to describe the input to output ratios of either power or voltages. Decibel is a generic performance specification used to describe performance independent of an application's operating voltage or power. The decibel is calculated on a logarithmic scale that allows performance specification across a wide range of voltage or power. At a frequency of approximately 3 GHz, a crosstalk noise level of approximately −20.4 dB is measured between neighboring wire bonds from different differential wire bond pairs. For example, the crosstalk may be measured between a wire bond from first differential wire bond pair 314 and its neighboring wire bond from second differential wire bond pair 316 in FIG. 3.

Referring now to FIG. 6, a graph illustrates differential crosstalk for staggered differential wire bond pairs illustrated in FIGS. 3 and 4. As in FIG. 5, the graph of FIG. 6 illustrates the relationship of frequency and crosstalk noise level, and also as in FIG. 5, generally, as frequency increases, noise level increases. At a frequency of approximately 3 GHz, a crosstalk noise level of approximately −42.7 dB is measured between differential wire bond pairs. For example, this may be considered the measured crosstalk between first differential wire bond pair 314 and second differential wire bond pair 316 in FIG. 3.

A chart shown in FIG. 7 illustrates single ended and differential crosstalk for different wire bond configurations, according to embodiments of the present invention. The chart illustrates crosstalk for specific configurations of wire bonds having specific dimensions. The chart is provided in order to illustrate the differences in the crosstalk resulting from three specific configurations. The present invention is not limited to these specific dimensions and changes in the dimensions may result in different crosstalk measurements. Regarding single ended crosstalk, or the cross talk between a single wire of a first differential wire bond pair and a proximate wire of a second differential wire bond pair, an original wire bond design, having a spacing of approximately 108 micrometers between differential wire bond pairs, results in crosstalk of approximately −16 dB. An embodiment having differential wire bond pairs formed in a long arc, as illustrated in FIGS. 1 and 2, results in crosstalk of approximately −18 dB. Finally, an embodiment having staggered differential wire bond pairs, as illustrated in FIGS. 3 and 4, results in crosstalk of approximately −20 dB, as shown in FIG. 5.

Regarding differential crosstalk, or the crosstalk between a first and a second differential wire bond pair, the original wire bond design described above results in crosstalk of approximately −34 dB. The embodiment having differential wire bond pairs in a long arc, as shown in FIGS. 1 and 2, results in crosstalk of approximately −37 dB. Finally, the embodiment having staggered differential wire bond pairs, as illustrated in FIGS. 3 and 4 results in crosstalk of approximately −43 dB, as shown in FIG. 6.

Therefore, in the embodiment illustrated in FIGS. 3 and 4, the simulated cross talk results for a staggered wire bond versus original wire bond design, demonstrated approximately a 37% (4 dB) improvement of the crosstalk noise level in the single ended wire-to-wire case. The percentage values are based on a logarithmic scale using decibels, where for a given dB value the corresponding voltage is given by $10^{db/20}$. For example, −16 dB translates to approximately 15.8% coupling, and −20 dB translates to approximately 10% coupling, resulting in a percent improvement of approximately 36.7%. For the differential wire bond pair-to-differential wire bond pair case, approximately a 65% (9 dB) improvement was observed. Therefore, the staggered differential wire bond pairs are shown to reduce noise level yield and enhance receiver performance, thereby lowering customer data error rates.

Referring now to FIG. 8, a flow diagram illustrates a wire-bonding methodology for an integrated circuit. This example methodology may be used to form the staggered differential wire bond pairs shown in FIGS. 3 and 4. In block 802, a wire that will form a first wire bond profile is bonded to a die of the integrated circuit. The wire that will form the first wire bond profile is terminated at a second bond site on the substrate in block 804. In block 806, blocks 802 and 804 may be repeated for additional wires having the same wire bond profile, forming one or more differential wire bond pairs.

In block 808, a wire that will form a second wire bond profile is bonded to the die of the integrated circuit. The wire that will form the second wire bond profile is terminated at the substrate of the integrated circuit in block 810. In block 812, blocks 808 and 810 may be repeated for additional wires having the same wire bond profile, forming one or more differential wire bond pairs that are disposed proximate to differential wire bond pairs having the first wire bond profile in an alternating manner. The bond sites of the first and second differential wire bond pairs of wire bonds at the substrate are staggered in distance from the die in a plan view of the integrated circuit.

The bonding tool avoids contacting existing wire bonds in the bonding operation and configures the wire bonds so that they are not in contact with one another. Alternative embodiments of the wire-bonding process may determine the proper wire bond profile for a specific wire as each wire bond profile is created. For example, the wire bonds may be created in their order along the edge of the die, continuously varying the wire bond profiles that are to be created.

FIG. 9 is a block diagram that illustrates an example of bonding system 900 in which a wire-bonding technique of the invention may be implemented. As illustrated, the system 900 comprises a bonding tool 902 coupled to a computer 904, which may comprise a processor 906 and a memory 908. One or more of the steps shown in FIG. 8 may be performed at least in part utilizing software executed by processor 906 and stored in memory 908. Also, other types of wire bonds described herein may be formed in this manner using the bonding system 900.

Accordingly, as described herein, the present invention in the illustrative embodiment provides an integrated circuit having wire bonds configured for improved high speed performance, and techniques for forming such wire bonds in the integrated circuit.

Additional embodiments of the present invention may incorporate various numbers and combinations of transistor die, leads, or other circuit elements, arranged in various configurations within a given integrated circuit. The positioning and number of transistor die and other elements will of course result in various numbers and configurations of wire bonds and associated bond sites. Further, additional embodiments may incorporate various wire bond shapes, wire bond heights, wire diameters and other wire characteristics.

Regarding the various numbers and combinations of transistor die, a plurality of identical die are typically formed in a repeated pattern on a surface of the wafer. Each die includes a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Therefore, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for performing a wire-bonding operation in an integrated circuit, utilizing a bonding tool, the method comprising the steps of:
   bonding a wire to a first bond site in the integrated circuit; and
   terminating the wire at a second bond site;
   wherein the bonding and terminating steps are repeated for at least two differential wire bond pairs, wherein individual wires within each of the at least two differential wire bond pairs have substantially similar wire bond profiles, and wherein proximate differential wire bond pairs of the at least two differential wire bond pairs have substantially different wire bond profiles. and
   wherein individual wires within each of the at least two differential wire bond pairs are adjacent to each other without other wires therebetween in a plan view of the integrated circuit.

2. The method of claim 1, wherein the step of bonding a wire to a first bond site comprises the step of bonding a wire to a die of the integrated circuit.

3. The method of claim 1, wherein the step of terminating a wire at a second bond site comprises the step of terminating a wire at an integrated circuit package substrate.

4. The method of claim 3, wherein the step of terminating the wire at an integrated circuit package substrate comprises the step of terminating the wire at a substrate on which one or more circuit elements are disposed, and to which the at least two differential wire bond pairs are terminated.

5. The method of claim 1, wherein a first differential wire bond pair of the at least two differential wire bond pairs comprises data signal input wire bonds, and a second differential wire bond pair of the at least two differential wire bond pairs comprises data signal output wire bonds.

6. The method of claim 1, wherein the proximate differential wire bond pairs have wire bond profiles with different heights above the first bond site in the integrated circuit.

7. The method of claim 1, wherein the proximate differential wire bond pairs have wire bond profiles with different lengths from the first bond site in the integrated circuit.

8. The method of claim 1, wherein the at least two differential wire bond pairs are staggered in length from the first bond site in the plan view of the integrated circuit.

9. The method of claim 1, wherein the bonding and terminating steps are repeated for differential wire bond pairs having a first wire bond profile, then repeated for differential wire bond pairs having a second wire bond profile.

10. The method of claim 1, wherein the proximate differential wire bond pairs have wire bond profiles with three segments.

11. The method of claim 1 wherein the proximate differential wire bond pairs have wire bond profiles with a continuous curve.

12. The method of claim 1, wherein either the first bond sites or the second bond sites are bonded to a common die.

13. The method of claim 1, wherein the bonding tool does not contact existing wire bonds in the bonding operation and wherein wire bonds are configured so that they are not in contact with one another.

14. An article of manufacture for performing a wire-bonding operation in an integrated circuit, utilizing a bonding tool, comprising a machine readable medium containing one or more programs which when executed implement the steps of:
bonding a wire to a first bond site in the integrated circuit; and
terminating the wire at a second bond site;
wherein the bonding and terminating steps are repeated for at least two differential wire bond pairs, wherein individual wires within each of the at least two differential wire bond pairs have substantially similar wire bond profiles, and wherein proximate differential wire bond pairs of the at least two differential wire bond pairs have substantially different wire bond profiles; and
wherein individual wires within each of the at least two differential wire bond pairs are adjacent to each other without other wires therebetween in a plan view of the integrated circuit.

15. The article of manufacture of claim 14, wherein the proximate differential wire bond pairs have wire bond profiles with different heights above the first bond site in the integrated circuit.

16. The article of manufacture of claim 14, wherein the proximate differential wire bond pairs have wire bond profiles with different lengths from the first bond site in the integrated circuit.

17. The method of claim 1, wherein the at least two differential wire bond pairs provide connections with a substrate for at least one of one or more circuit elements disposed on the substrate.

18. The article of manufacture of claim 14, wherein the at least two differential wire bond pairs provide connections with a substrate for at least one of one or more circuit elements disposed on the substrate.

19. The article of manufacture of claim 14, wherein the at least two differential wire bond pairs are staggered in length from the first bond site in the plan view of the integrated circuit.

20. The article of manufacture of claim 14, wherein either the first bond sites or the second bond sites are bonded to a common die.

* * * * *